(12) United States Patent
Segev et al.

(10) Patent No.: US 10,370,766 B2
(45) Date of Patent: Aug. 6, 2019

(54) HYBRID PHOTO-ELECTROCHEMICAL AND PHOTO-VOLTAIC CELLS

(71) Applicants: The Regents of the University of California, Oakland, CA (US); Technion—Israel Institute of Technology, Haifa (IL)

(72) Inventors: Gideon Segev, Berkeley, CA (US); Ian D. Sharp, Garching (DE); Hen Dotan, Richan (IL); Avner Rothschild, Richan (IL)

(73) Assignee: The Regents of the University of California, Oakland, CA (US)

( * ) Notice: Subject to any disclaimer, the term of this patent is extended or adjusted under 35 U.S.C. 154(b) by 98 days.

(21) Appl. No.: 15/794,312

(22) Filed: Oct. 26, 2017

(65) Prior Publication Data

US 2018/0119292 A1    May 3, 2018

Related U.S. Application Data

(60) Provisional application No. 62/413,885, filed on Oct. 27, 2016.

(51) Int. Cl.
*C25B 1/04* (2006.01)
*H01L 31/04* (2014.01)
(Continued)

(52) U.S. Cl.
CPC ............. *C25B 1/003* (2013.01); *C25B 1/04* (2013.01); *C25B 9/00* (2013.01); *C25B 11/0415* (2013.01);
(Continued)

(58) Field of Classification Search
CPC .................................................. C25B 1/003
(Continued)

(56) References Cited

U.S. PATENT DOCUMENTS 4,451,691 A * 5/1984 Fraas ................... H01L 27/142
136/249
8,749,256 B2    6/2014 Apolloni et al.
(Continued)

OTHER PUBLICATIONS

Doping (semiconductor), Wikipedia article, archived version from Jul. 2017, accessed at https://en.wikipedia.org/w/index.php?title=Doping_(semiconductor)&oldid=793262484 on Mar. 29, 2019 (Year: 2017).*

(Continued)

Primary Examiner — Harry D Wilkins, III

(57) ABSTRACT

This disclosure provides systems, methods, and apparatus related to a hybrid photo-electrochemical and photo-voltaic cell. In one aspect, device includes a substrate comprising a semiconductor, a transparent conductor disposed on the second surface of the substrate, a photoanode disposed on the transparent conductor, an electrolyte in electrical communication with the photoanode, and an electrode in contact with the electrolyte. The substrate is doped with a first n-type dopant. A first area of a first surface of the substrate is heavily doped with a first p-type dopant. A second area of the first surface of the substrate is heavily doped with a second n-type dopant. The second surface of the substrate is heavily doped with a second p-type dopant. The electrode is in electrical contact with the second area. The first area is in electrical contact with the second area through an electrical load.

20 Claims, 17 Drawing Sheets

(51) Int. Cl.

| | | |
|---|---|---|
| *C25B 9/00* | (2006.01) | |
| *C25B 1/00* | (2006.01) | |
| *H02S 10/10* | (2014.01) | |
| *C25B 11/04* | (2006.01) | |
| *H01G 9/20* | (2006.01) | |
| *H01L 31/0288* | (2006.01) | |
| *H02J 3/38* | (2006.01) | |
| *H01L 31/0296* | (2006.01) | |
| *H01L 31/0304* | (2006.01) | |
| *H01L 31/068* | (2012.01) | |
| *H01L 31/0687* | (2012.01) | |

(52) U.S. Cl.
CPC ............... *H01G 9/20* (2013.01); *H01L 31/04* (2013.01); *H02S 10/10* (2014.12); *H01L 31/0288* (2013.01); *H01L 31/02963* (2013.01); *H01L 31/03042* (2013.01); *H01L 31/03046* (2013.01); *H01L 31/0682* (2013.01); *H01L 31/0687* (2013.01); *H02J 3/385* (2013.01); *Y02E 60/366* (2013.01); *Y02P 20/135* (2015.11)

(58) Field of Classification Search
USPC .......................................................... 205/340
See application file for complete search history.

(56) References Cited

U.S. PATENT DOCUMENTS

| | | | |
|---|---|---|---|
| 9,722,533 B2 | 8/2017 | El-Ghoroury et al. | |
| 2003/0092226 A1* | 5/2003 | Nagashima | H01L 31/02167 438/184 |
| 2004/0262154 A1* | 12/2004 | Gibson | C25B 1/003 204/280 |
| 2005/0059186 A1* | 3/2005 | Kelly | C25B 1/003 438/73 |
| 2008/0223439 A1* | 9/2008 | Deng | C25B 1/003 136/258 |
| 2010/0133110 A1* | 6/2010 | Nocera | C25B 1/003 205/340 |
| 2010/0133111 A1* | 6/2010 | Nocera | C25B 1/003 205/633 |
| 2011/0005590 A1* | 1/2011 | Walukiewicz | C25B 1/003 136/256 |
| 2014/0090976 A1* | 4/2014 | Rotschild | H01G 9/2068 204/267 |
| 2014/0332374 A1* | 11/2014 | Deutsch | H01L 21/283 204/242 |
| 2015/0068915 A1* | 3/2015 | Hoch | C25B 1/04 205/340 |
| 2015/0194551 A1 | 7/2015 | Crist et al. | |
| 2017/0040557 A1* | 2/2017 | Bailie | H01L 51/4213 |
| 2017/0125621 A1 | 5/2017 | Jungwirth et al. | |

OTHER PUBLICATIONS

Abdi et al, Efficient solar water splitting by enhanced charge separation in a bismuth vanadate-silicon tandem photoelectrode, Nature Communications, vol. 4, Jul. 2013, Article No. 2195 (Year: 2013).*
Khaselev et al, A Monolithic Photovoltaic-Photoelectrochemical Device for Hydrogen Production via Water Splitting, Science, vol. 280, No. 5362, Apr. 1998, pp. 425-427 (Year: 1998).*
Y. Pihosh et al., "Photocatalytic generation of hydrogen by core-shell WO3/BiVO4 nanorods with ultimate water splitting efficiency," Sci. Rep., vol. 5, p. 11141, Jun. 2015.
W. W. P. Mulligan et al., "Manufacture of solar cells with 21% efficiency," Proc. 19th EPVSEC, No. 408, pp. 3-6, 2004.
R. Sathre et al., "Opportunities to improve the net energy performance of photoelectrochemical water-splitting technology," Energy Environ. Sci., vol. 9, pp. 803-819, 2016.
T. Nagashima et al., "Three-terminal tandem solar cells with a back-contact type bottom cell," Conf. Rec. IEEE Photovolt. Spec. Conf., vol. 2000—Jan., pp. 1193-1196, 2000.
G. Segev et al., "Equivalent circuit models for triple-junction concentrator solar cells," Sol. Energy Mater. Sol. Cells, vol. 98, pp. 57-65, Mar. 2012.
K. Nishioka et al, "Evaluation of InGaP/InGaAs/Ge triple-junction solar cell and optimization of solar cell's structure focusing on series resistance for high-efficiency concentrator photovoltaic systems," Sol. Energy Mater. Sol. Cells, vol. 90, No. 9, pp. 1308-1321, May 2006.
F. Guo et al., "A generic concept to overcome bandgap limitations for designing highly efficient multi-junction photovoltaic cells," Nature Communications, vol. 6, No. 7730, pp. 1-9, Jul. 2015.
S. Sista et al., "High-Efficiency Polymer Tandem Solar Cells with Three-Terminal Structure," Advanced Energy Materials, vol. 22, pp. E77-E80, 2010.
C. Tai et al., "Three-Terminal Amorphous Silicon Solar Cells," International Journal of Photoenergy, vol. 2011, pp. 1-6, 2011.
K. Walczak et al., "Hybrid Composite Coatings for Durable and Efficient Solar Hydrogen Generation under Diverse Operating Conditions." Advanced Energy Materials, vol. 7, No. 13, pp. 1-12, 2017.

* cited by examiner

HYBRID PHOTO-ELECTROCHEMICAL AND PHOTO-VOLTAIC CELLS

RELATED APPLICATIONS

This application claims priority to U.S. Provisional Patent Application No. 62/413,885, filed Oct. 27, 2016, which is herein incorporated by reference.

STATEMENT OF GOVERNMENT SUPPORT

This invention was made with government support under Contract Nos. DE-AC02-05CH11231 and DE-SC0004993 awarded by the U.S. Department of Energy. The government has certain rights in this invention.

TECHNICAL FIELD

This disclosure relates generally to photo-electrochemical cells and more particularly to hybrid photo-electrochemical and photo-voltaic cells.

BACKGROUND

Solar water splitting is being investigated in the search for a production method of clean renewable fuels. However, the vast majority of the water splitting photo-electrochemical cells cannot drive the water splitting reaction without the assistance of an external power source. In order to provide the photo-electrochemical cell (PEC) the added power, the cells are usually connected to photovoltaic devices in a tandem arrangement or as external power sources.

These two methods suffer from severe disadvantages, however. In the tandem arrangement, the PEC is connected in series to a photo-voltaic (PV) cell. As a result, the current through the system is determined by the PEC current, which is significantly lower than the maximum power point current of the PV cell. As a result, the operating point of the PV cell is far from optimal and the overall system efficiency is very low. When a PV cell is connected to a PEC through a DC-DC converter (e.g., as an external power source), the operating point of each subsystem can be chosen independently. However, since the PV cell must be decoupled from the PEC, this comes at the price of a significant increase in the system magnitude and additional losses inflicted by the DC-DC conversion.

SUMMARY

A multi-terminal PEC and PV system, the hybrid PEC and PV system (HPEV), is described herein. As in the tandem photo-electrochemical cells, the PEC is optically connected in series with the PV cell. A third contact is added to the PV cell, allowing it to extract surplus current that is not utilized by the chemical reaction. For example, instead of covering the entire top surface of the PV cell with the water splitting layer, a part of it can be utilized for selective contacts that are isolated from the electrolyte. The added contacts can extract the PV cell surplus current and allow parallel production of both electrical power and fuel. In a back contact arrangement, the second contact is at the back surface of the PV cell and the entire top surface can be used to drive current to the chemical reaction.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
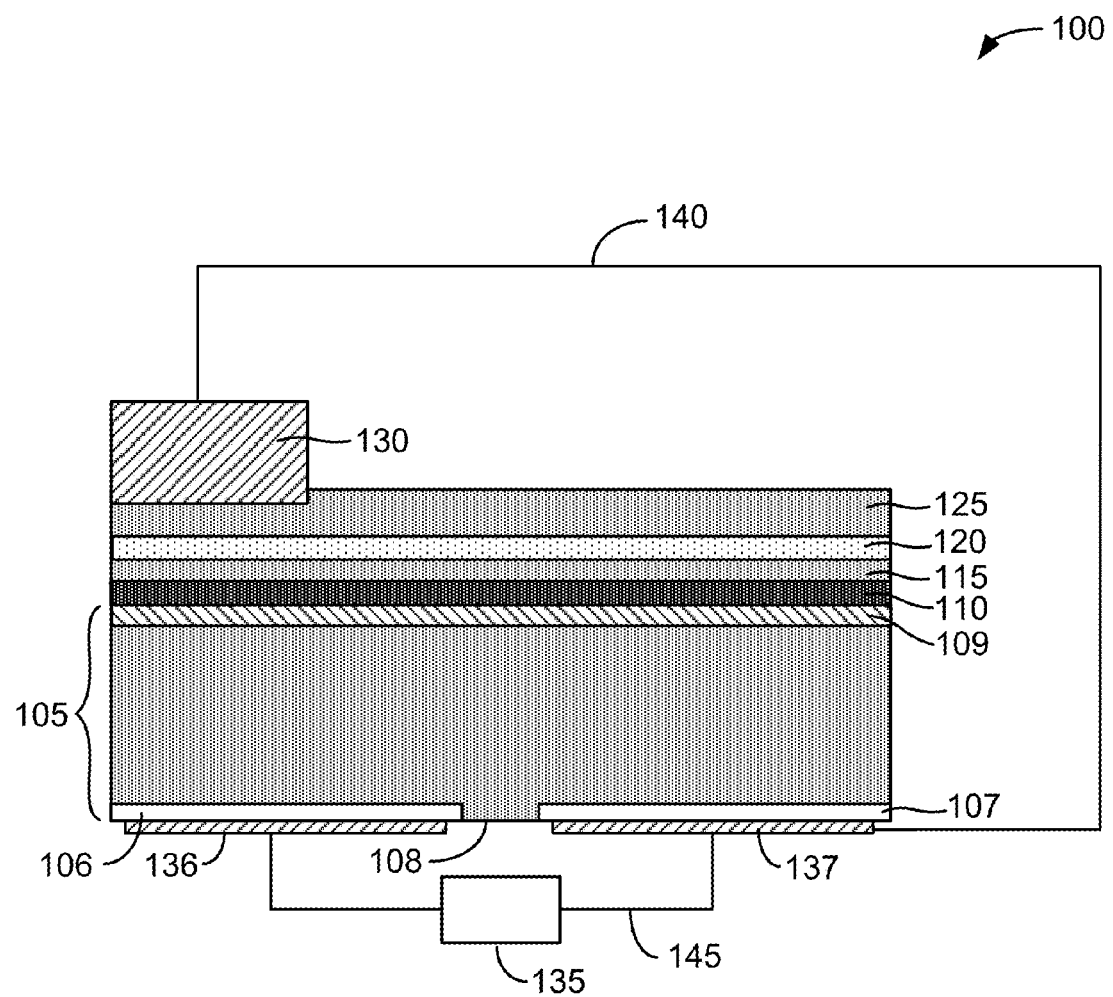
FIG. 1 shows an example of a schematic illustration of a HPEV cell.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 85% of the targeted value, within 90% of the targeted value, within 95% of the targeted value, or within 99% of the targeted value.

Hybrid Photo-Electrochemical and Photo-Voltaic Cells

The utilization of solar energy to drive electrochemical reactions is studied for energy storage, the production of carbon-neutral fuels, environmental remediation, and other applications. For example, solar water splitting generates renewable hydrogen that can power fuel cells and solar $CO_2$ reduction produces carbon-based fuels and industrial raw materials (e.g., ethylene) using atmospheric $CO_2$ as a feedstock. However, in most solar-driven electrochemical devices, the chemical reaction is the performance limiting factor, resulting in current densities that are far below the thermodynamic efficiency limit, considering the solar energy input.

Described herein is a new class of devices, referred to as hybrid photoelectrochemical and photovoltaic (HPEV) cells. Such HPEV cells overcome the problem of mismatched charge generation and chemical conversion rates by adding a third electrical contact (i.e., terminal) to the photovoltaic element. This third contact allows photogenerated charge carriers that are not consumed by the chemical reaction to be collected as electrical current, thereby producing electrical power at the same time that chemicals are produced. The production of electrical power can be done without impeding the chemical reaction, thereby increasing the overall efficiency of the system dramatically.

FIG. 1 shows an example of a schematic illustration of a HPEV cell. In this example the PV cell is made of a semiconductor, over which a photo-electrode material is deposited. The PV cell bulk is n-type doped and the PEC operates as a photoanode. A photocathode based cell can be made with the opposite doping profiles. The HPEV cell shown in FIG. 1 is configured to be used to drive a water splitting reaction (e.g., generating hydrogen). A HPEV cell can also be used for a whole range of chemical reactions, including $CO_2$ reduction reactions, nitrogen fixation reactions, organics for oxidation (e.g., environmental remediation), and redox couples for redox flow batteries.

As shown in FIG. 1, a HPEV cell 100 comprises a substrate 105 comprising a semiconductor, a transparent conductor 110 disposed on a second surface of the substrate 105, a photoanode 115 disposed on the transparent conductor 110, an electrolyte 125 in electrical communication with the photoanode 115, and an electrode 130 in contact with the electrolyte 125. For example, when the electrolyte 125 is a liquid, at least a portion of the electrode 130 may be immersed in the electrolyte 125.

In some embodiments, the semiconductor comprises a direct bad gap semiconductor, such as gallium arsenide, cadmium telluride, or gallium indium phosphide, for example. In some embodiments, the semiconductor comprises an indirect band gap semiconductor, such as silicon or germanium, for example. In some embodiments, the semiconductor is selected from a group consisting of silicon, germanium, gallium arsenide, cadmium telluride, and gallium indium phosphide.

In some embodiments, the semiconductor is doped with a first n-type dopant. A first area 106 of a first surface of the substrate 105 is heavily doped with a first p-type dopant. A second area 107 of the first surface of the substrate 105 is heavily doped with a second n-type dopant. A third area 108 of the first surface of the substrate 105 is between the first area 106 and the second area 107. A second surface 109 of the substrate is heavily doped with a second p-type dopant. The electrode 130 is in electrical contact with the second area 107. The first area 106 and the second area 107 are electrically connected through an electrical load (e.g., a maximum power point tracker). In some embodiments, a distance between a center of the first area 106 and a center of the second area 107 is about the thickness of the substrate.

In some embodiments, the first surface and the second surface of the substrate 105 are substantially parallel. In some embodiments, the substrate is about 100 microns to 300 microns thick. In some embodiments, the substrate is about 0.5 microns to 2 microns thick. For example, when the semiconductor is gallium arsenide, the substrate may be about 1 micron thick.

In some embodiments, the first n-type dopant and the second n-type dopant are selected from a group consisting of phosphorus, arsenic, and antimony. In some embodiments, the first n-type dopant and the second n-type dopant are the same type of dopants (e.g., the same element). In some embodiments, the first p-type dopant and the second p-type dopant are selected from a group consisting of aluminum and boron. In some embodiments, the first p-type dopant and the second p-type dopants are the same type of dopants (e.g., the same element). In some embodiments, the semiconductor is doped to a level of about $10^{14}$ atoms/cm$^3$ to $10^{16}$ atoms/cm$^3$. In some embodiments, the first area 106, the second area 107, and the second surface 109 are doped to a level of about $10^{18}$ atoms/cm$^3$ to $10^{20}$ atoms/cm$^3$. In some embodiments, a level of doping of the first area 106, the second area 107, and the second surface 109 is about three orders of magnitude higher or at least about three orders of magnitude higher than a level of doping of the semiconductor.

In some embodiments, the HPEV cell 100 further comprises a first pad 136 in contact with the first area 106 and a second pad 137 in contact with the second area 107. In some embodiments, the first pad 136 and the second pad 137 comprise a metal. In some embodiments, a material of the first pad 136 and the second pad 137 is selected from a group consisting of aluminum, silver, and gold. In some embodiments, electrical contact between the electrode 130 and the second area 107 is via a first wire or a first cable 140. The electrical contact between the electrode 130 and the second area 107 forms the photoelectrochemical cell. In some embodiments, the first area 106 and the second area 107 are electrically connected through an electrical load (e.g., a maximum power point tracker) via a second wire or a second cable 145. This electrical contact forms the photovoltaic cell. The first pad 136 and the second pad 137 can provide a way in which the wires or cables 140 and 145 are in electrical contact with the first area 106 and the second area 107.

In some embodiments, the transparent conductor 110 is selected from a group consisting of indium tin oxide, fluorine-doped tin oxide, and aluminum-doped zinc oxide. In some embodiments, the photoanode 115 is selected from a group consisting of gallium indium phosphide, iron oxide, and bismuth vanadate. In some embodiments, a bandgap of the photoanode 115 is larger than a bandgap of the semiconductor of the substrate 105.

In some embodiments, the HPEV cell 100 further comprises a protection layer 120 disposed on the photoanode 115. In some embodiments, the protection layer 120 comprises a metal oxide, such as titanium dioxide, for example. The protection layer 120 may serve to protect the photoanode 115 from the electrolyte 125 (e.g., from dissolution or corrosion). In some embodiments, the HPEV cell 100 further includes a catalyst disposed on the photoanode 115. For example, the catalyst may comprise iridium. In some embodiments, the electrolyte 125 comprises sodium hydroxide, potassium hydroxide, or sulfonic acid. These electrolytes can be used for a water-spitting PEC cell.

In some embodiments, the electrode 130 comprises a metal. For example, the electrode 130 may comprise a metal that can drive a second half reaction with low overpotentials. In some embodiments, the electrode 130 comprises a noble metal (e.g., platinum, gold). In some embodiments, the electrode 130 has a high stability in the electrolyte 125 and is not decomposed by the second half reaction. Half of the PEC cell reaction occurs at the electrode 130. For example, when the PEC includes a photoanode and performs water splitting, oxygen will be formed on the surface of the protection layer 120 and hydrogen will be formed on the surface of the electrode 130.

In some embodiments, the electrode 130 comprises a photocathode. In some embodiments, the photocathode comprises gallium phosphide. When the PEC cell of the HPEV cell 100 performs a photochemical reaction that requires a high potential (e.g., $CO_2$ reduction), the electrode 130 being a photocathode can aid in performance of the reaction.

In some embodiments, the HPEV cell 100 further comprises a passivation layer (not shown) disposed on the third area. The passivation layer may also be disposed on additional regions of the first surface of the substrate 105 not covered by the first area 106 or the second area 107. In some embodiments, the passivation layer is selected from a group consisting of silicon dioxide ($SiO_2$) and silicon nitride ($Si_3N_4$).

In some embodiments, when in operation, the HPEV cell 100 further includes a maximum power point tracker (MPPT) 135 in the electrical connection between the first area 106 and the second area 107. Generally, a MPPT is an electronic DC to DC converter that optimizes the match between a solar array (e.g., photovoltaic panels) and the battery bank or utility grid to which the solar array is connected. In the HPEV cell 100, the MPPT functions to extract power from the photovoltaic cell of the HPEV cell 100 and send it to the electrical grid or other circuit.

When the HPEV cell 100 is in operation, photons are absorbed in the semiconductor of the substrate 105 and electron hole pairs are generated. The photogenerated electrons flow to the second area 107 (e.g., the area heavily doped with an n-type dopant), as in a photovoltaic cell. The photogenerated holes have two possible routes. The holes can flow towards second surface of the substrate 105 (e.g., the surface heavily doped with a p-type dopant) where they will be injected into the photoanode 115 and participate in the photoelectrochemical reaction. The holes can also can flow to the first area 106 (e.g., the area heavily doped with a p-type dopant) and contribute to the electrical power output of the HPEV cell 100. By controlling the electrode 130 and the photovoltaic cell potentials, the portion of the current used to drive the chemical reaction can be controlled.

Figure 2:
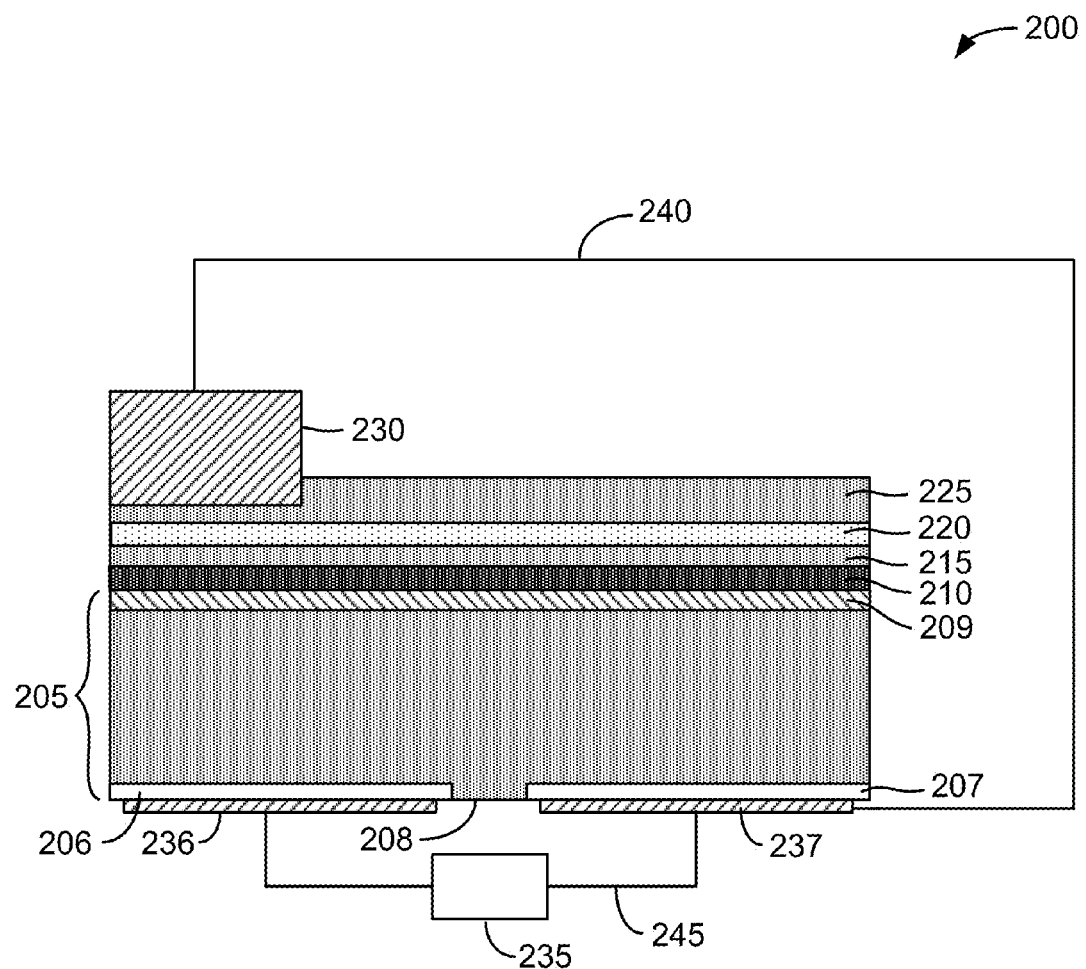
FIG. 2 shows an example of a schematic illustration of a HPEV cell.

FIG. 2 shows an example of a schematic illustration of a HPEV cell. The HPEV cell 200 shown in FIG. 2 is similar to the HPEV cell 100 shown in FIG. 1 but has an opposite doping profile and the PEC operates as a photocathode. In some embodiments, components of the HPEV cell 200 are similar to or the same as the components of the HPEV cell 100.

As shown in FIG. 2, a HPEV cell 200 comprises a substrate 205 comprising a semiconductor, a transparent conductor 210 disposed on a second surface of the substrate 205, a photocathode 215 disposed on the transparent conductor 210, an electrolyte 225 in electrical communication with the photocathode 215, and an electrode 230 in contact with the electrolyte 225. For example, when the electrolyte 225 is a liquid, at least a portion of the electrode 230 may be immersed in the electrolyte 225.

In some embodiments, the semiconductor comprises a direct bad gap semiconductor, such as gallium arsenide, cadmium telluride, or gallium indium phosphide, for example. In some embodiments, the semiconductor comprises an indirect band gap semiconductor, such as silicon or germanium, for example. In some embodiments, the semiconductor is selected from a group consisting of silicon, germanium, gallium arsenide, cadmium telluride, and gallium indium phosphide.

In some embodiments, the semiconductor is doped with a first p-type dopant. A first area 206 of a first surface of the substrate 205 is heavily doped with a first n-type dopant. A second area 207 of the first surface of the substrate 205 is heavily doped with a second p-type dopant. A third area 208 of the first surface of the substrate 205 is between the first area 206 and the second area 207. A second surface 209 of the substrate is heavily doped with a second n-type dopant. The electrode 230 is in electrical contact with the second area 207. The first area 206 and the second area 207 are in electrical contact through an electrical load.

In some embodiments, the first surface and the second surface of the substrate 205 are substantially parallel. In some embodiments, the substrate is about 100 microns to 300 microns thick. In some embodiments, the substrate is about 0.5 microns to 2 microns thick. For example, when the semiconductor is gallium arsenide, the substrate may be about 1 micron thick.

In some embodiments, the first n-type dopant and the second n-type dopant are selected from a group consisting of phosphorus, arsenic, and antimony. In some embodiments, the first n-type dopant and the second n-type dopant are the same type of dopants (e.g., the same element). In some embodiments, the first p-type dopant and the second p-type dopant are selected from a group consisting of aluminum and boron. In some embodiments, the first p-type dopant and the second p-type dopants are different type of dopants (e.g., different elements). In some embodiments, the semiconductor is doped to a level of about $10^{14}$ atoms/cm$^3$ to $10^{16}$ atoms/cm$^3$. In some embodiments, the first area 206, the second area 207, and the second surface 209 are doped to a level of about $10^{18}$ atoms/cm$^3$ to $10^{20}$ atoms/cm$^3$. In some embodiments, a level of doping of the first area 206, the second area 207, and the second surface 209 is about three orders of magnitude higher or at least about three orders of magnitude higher than a level of doping of the semiconductor. In some embodiments, a distance between a center of the first area 206 and a center of the second area 207 is about the thickness of the substrate.

In some embodiments, the HPEV cell 200 further comprises a first pad 236 in contact with the first area 206 and a second pad 237 in contact with the second area 207. In some embodiments, the first pad 236 and the second pad 237 comprise a metal. In some embodiments, a material of the first pad 236 and the second pad 237 is selected from a group consisting of aluminum, silver, and gold. In some embodiments, electrical contact between the electrode 230 and the second area 207 is via a first wire or a first cable 240. In some embodiments, the first area 206 and the second area 207 are electrically connected through an electrical load via a second wire or a second cable 245. The first pad 236 and the second pad 237 can provide a way in which the wires or cables 240 and 245 are in electrical contact with the first area 206 and the second area 207.

In some embodiments, the transparent conductor 210 is selected from a group consisting of indium tin oxide, fluorine-doped tin oxide, and aluminum-doped tin oxide. In some embodiments, the photocathode 215 comprises a p-type semiconductor with a protection layer (e.g. $TiO_2$) disposed thereon. In some embodiments, the photocathode 215 is selected from a group consisting of gallium phosphide, gallium indium phosphide, and cuprous oxide. In some embodiments, a bandgap of the photocathode 215 is larger than a bandgap of the semiconductor of the substrate 205. In some embodiments, the HPEV cell 200 further comprises a protection layer 220 disposed on the photocathode 215. In some embodiments, the protection layer 220 comprises a metal oxide, such as titanium dioxide, for example. The protection layer 220 may serve to protect the photocathode from the electrolyte 225 (e.g., from dissolution or corrosion). In some embodiments, the electrolyte 225 comprises sodium sulfate, sodium borate, or sulfonic acid.

In some embodiments, the electrode 230 comprises a metal. For example, the electrode 230 may comprise a metal that can drive a second half reaction with low overpotentials. In some embodiments, the electrode 230 comprises a noble metal (e.g., platinum). In some embodiments, the electrode 230 has a high stability in the electrolyte 225 and is not decomposed by the second half reaction. In some embodiments, a layer of a catalyst (e.g., iridium) is disposed on the electrode 230. Half of the PEC cell reaction occurs at the electrode 230. For example, when the PEC includes a photocathode and performs water splitting, oxygen will be formed on the surface of the electrode 230 and hydrogen will be formed on the surface of the protection layer 220.

In some embodiments, the electrode 230 comprises a photoanode. In some embodiments, the photoanode is selected from a group consisting of gallium indium phosphide, iron oxide, and bismuth vanadate. When the PEC cell of the HPEV cell 200 performs a photochemical reaction that requires a high potential (e.g., $CO_2$ reduction), the electrode 230 being a photoanode can aid in performance of the reaction.

In some embodiments, when in operation, the HPEV cell 200 further includes a maximum power point tracker (MPPT) 235 in the electrical connection between the first area 206 and the second area 207.

When the HPEV cell 200 is in operation, photons are absorbed in the semiconductor of the substrate 205 and electron hole pairs are generated. The photogenerated holes flow to the second area 207 (e.g., the area heavily doped with a p-type dopant), as in a photovoltaic cell. The photogenerated electrons have two possible routes. The electrons can flow towards second surface of the substrate 205 (e.g., the surface heavily doped with an n-type dopant) where they will be injected into the photocathode 215 and participate in the photoelectrochemical reaction. The electrons can also can flow to the first area 206 (e.g., the area heavily doped with an n-type dopant) and contribute to the electrical power output of the HPEV cell 200. By controlling the electrode 230 and the photovoltaic cell potentials, the portion of the current used to drive the chemical reaction can be controlled.

Figure 3A:
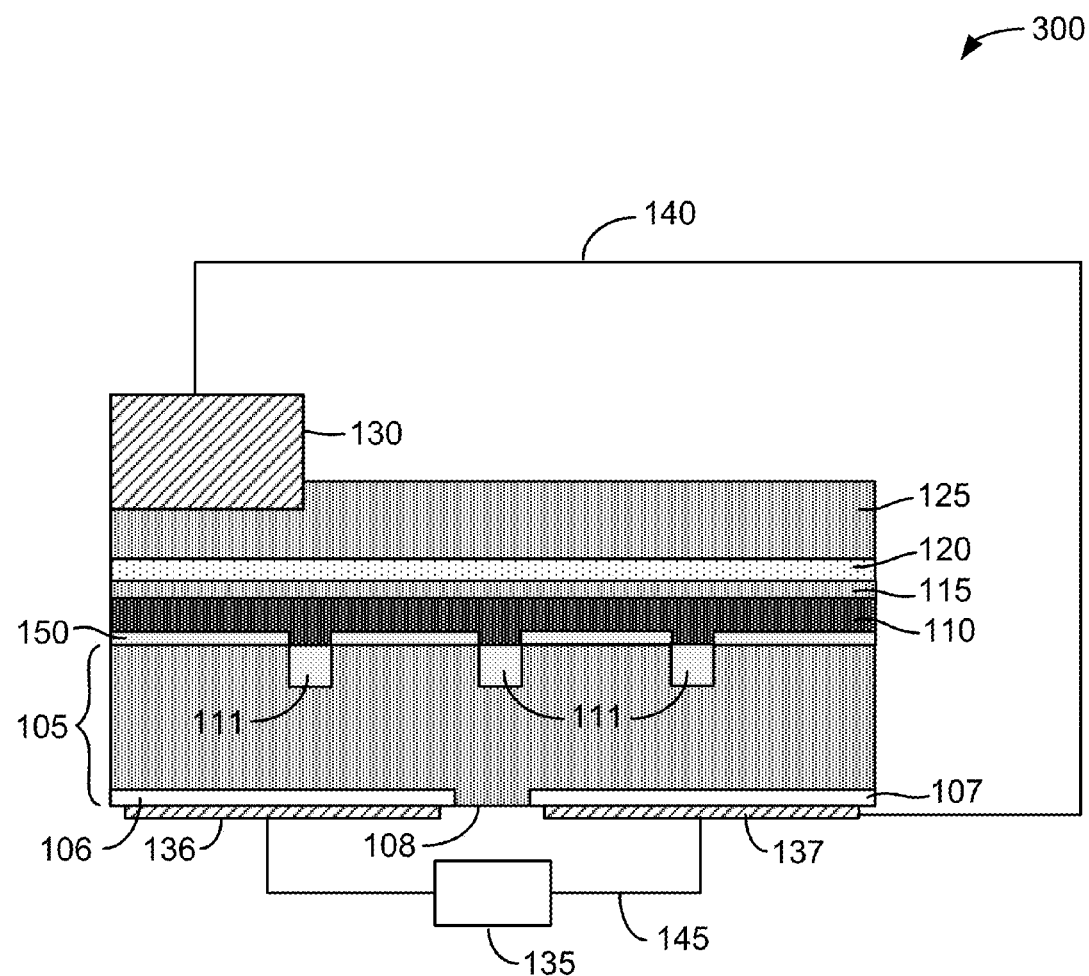
FIG. 3A shows an example of a schematic illustration of a HPEV cell.

FIG. 3A shows an example of a schematic illustration of a HPEV cell. The HPEV cell 300 shown in FIG. 3A is similar to the HPEV cell 100 shown in FIG. 1, with a different configuration of the second surface of the substrate 105 and with the addition of passivation layers 150 disposed on the second surface. In some embodiments, the other elements of the HPEC cell 300 are similar to or the same as the components of the HPEV cell 100.

As shown in FIG. 3A, the HPEV cell 300 comprises a substrate 105 comprising a semiconductor, a transparent conductor 110 disposed on a second surface of the substrate 105, a photoanode 115 disposed on the transparent conductor 110, an electrolyte 125 in electrical communication with the photoanode 115, and an electrode 130 in contact with the electrolyte 125. In some embodiments, the HPEV cell 100 further comprises a protection layer 120 disposed on the photoanode 115.

In some embodiments, the semiconductor is doped with a first n-type dopant. A first area 106 of a first surface of the substrate 105 is heavily doped with a first p-type dopant. A second area 107 of the first surface of the substrate 105 is heavily doped with a second n-type dopant. A third area 108 of the first surface of the substrate 105 is between the first area 106 and the second area 107. Areas 111 of the second surface of the substrate are heavily doped with a second p-type dopant. In some embodiments, the areas 111 of the second surface of the substrate comprise strips (e.g., running into the page of FIG. 3A) of the second surface that are heavily doped with the second p-type dopant. In some embodiments, the areas 111 of the second surface of the substrate comprise areas of the second surface that are heavily doped with the second p-type dopant. In some embodiments, areas of the second surface that are not heavily doped with a second p-type dopant have a passivation layer 150 disposed thereon. In some embodiments, the passivation layer 150 is selected from a group consisting of $SiO_2$ and $Si_3N_4$. The areas 111 of the second surface that are heavily doped and the areas that have a passivation layer disposed thereon can help to reduce surface recombination losses at the second surface. This can increase the overall solar energy conversion efficiency of a HPEV cell. The electrode 130 is in electrical contact with the second area 107. The first area 106 is in electrical contact with the second area 107 through an electrical load.

In some embodiments, the HPEV cell 100 further comprises a first pad 136 in contact with the first area 106 and a second pad 137 in contact with the second area 107. In some embodiments, the first pad 136 and the second pad 137 comprise a metal. In some embodiments, a material of the first pad 136 and the second pad 137 are selected from a group consisting of aluminum, silver, and gold. In some embodiments, electrical contact between the electrode 130 and the second area 107 is via a first wire or a first cable 140. In some embodiments, electrical contact between the first area 106 and the second area 107 is via a second wire or a second cable 145.

In some embodiments, when in operation, the HPEV cell 100 further includes a maximum power point tracker (MPPT) 135 in the electrical connection between the first area 106 and the second area 107.

A HPEV cell having an opposite doping profile from the HPEV cell 300 shown in FIG. 3A also can be fabricated. In such a HPEV cell, the PEC operates as a photocathode.

The HPEV cells described herein have numerous advantages. First, a HPEV cell allows each of the electrical and chemical components to operate at a nearly independent electrical operating points. This can allow for the extraction of electric power at a maximum operation point while driving the PEC reaction, which increases the overall system efficiency. Second, the amount of fuel or electricity produced can be chosen in real time according to demand.

In the HPEV cells described herein, controlling the portion of current used to drive the PEC cell reaction may be difficult. The quality of the materials used in a HPEV cell and the configuration of the doped regions of the substrate can affect the control of the portion of the current used to the drive the PEC cell.

The HPEV cells described herein have been described referencing liquid electrolytes. HPEV cells similar to the HPEV cells described herein could also function as gas-fed devices. In such HPEV cells, instead of a liquid electrolyte being present, a gas and/or water vapor would be present.

Figure 3B:
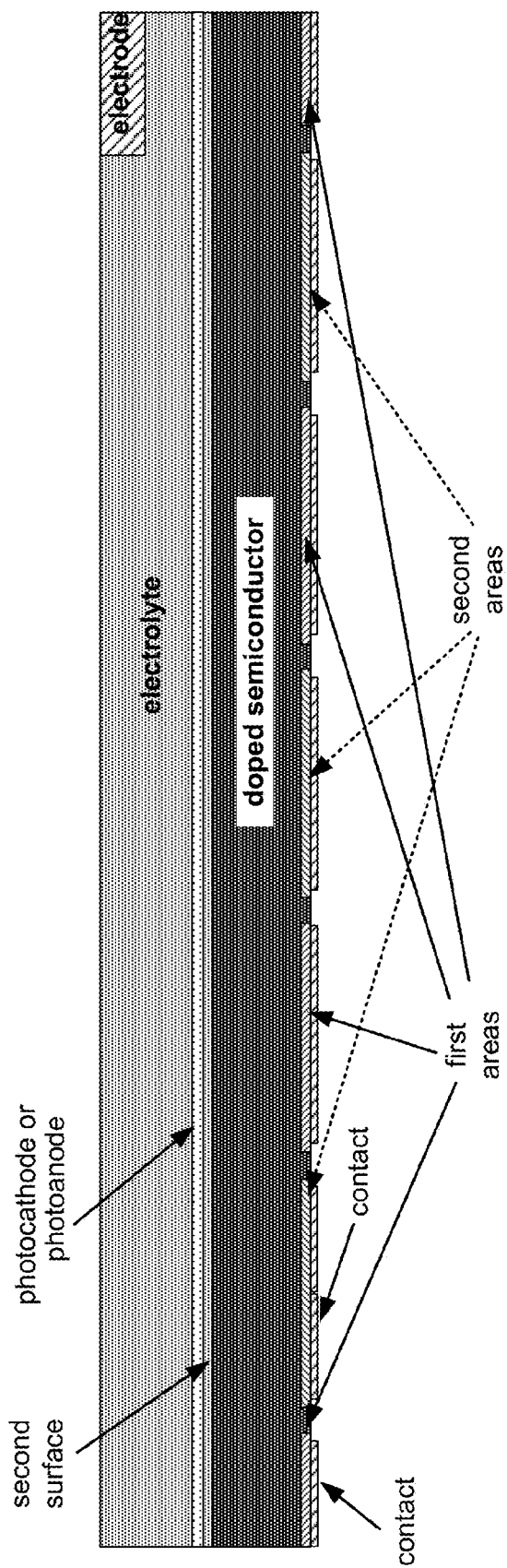
FIG. 3B shows an example of a schematic illustration of a HPEV cell.

Note that the HPEV cells 100, 200, and 300 shown in FIGS. 1, 2, and 3A, respectively, illustrate a small portion of a HPEV cell that would be used in industry. For example, the HPEV cells 100, 200, and 300 may comprise an about 100 micron cross-section of a HPEV cell that would be used in industry. A HPEV cell that would be used in industry would include repeating the device configuration shown in FIGS. 1, 2, and 3A to the right and to the left (e.g., on a single substrate) to form a specified size of a HPEV cell. An example of such a HPEV cell is shown in FIG. 3B. Not shown in FIG. 3B are a transparent conductor disposed on the second surface of the substrate and the layers of material that may be disposed on the photocathode or the photoanode.

The following examples are intended to be examples of the embodiments disclosed herein, and are not intended to be limiting.

Example—Device Modeling

The performance of a HPEV cell was studied through solid state device simulation. The simulated device was a three terminal silicon (Si) solar cell where the bulk was lightly doped n-type (e.g., similar to the device shown in FIG. 1). The common contact was through a highly doped $n^+$ region located on the back surface. A second contact was made through a $p^+$ contact also at the back surface of the cell, and the third contact was through another $p^+$ layer covering the entire top surface (e.g., the surface facing the sun).

Figure 4A:
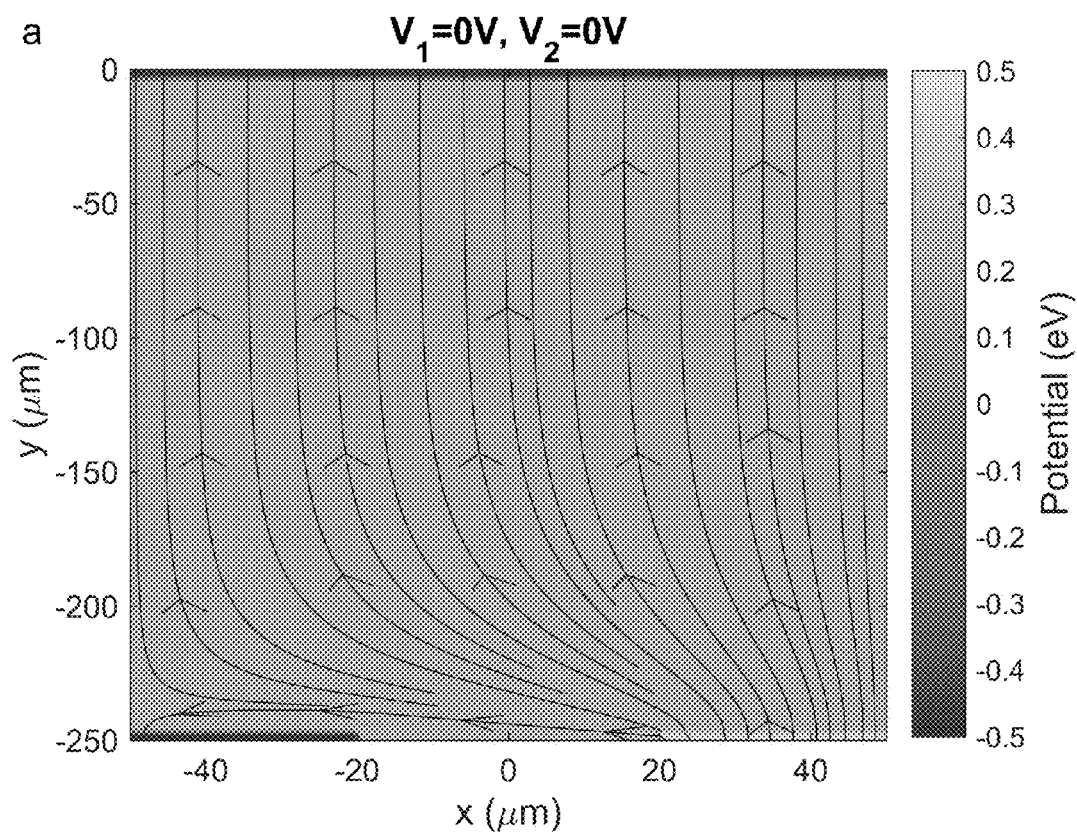
FIGS. 4A-4C show examples of streamlines of the current flow through a three terminal solar cell under different biases.
Figure 4B:
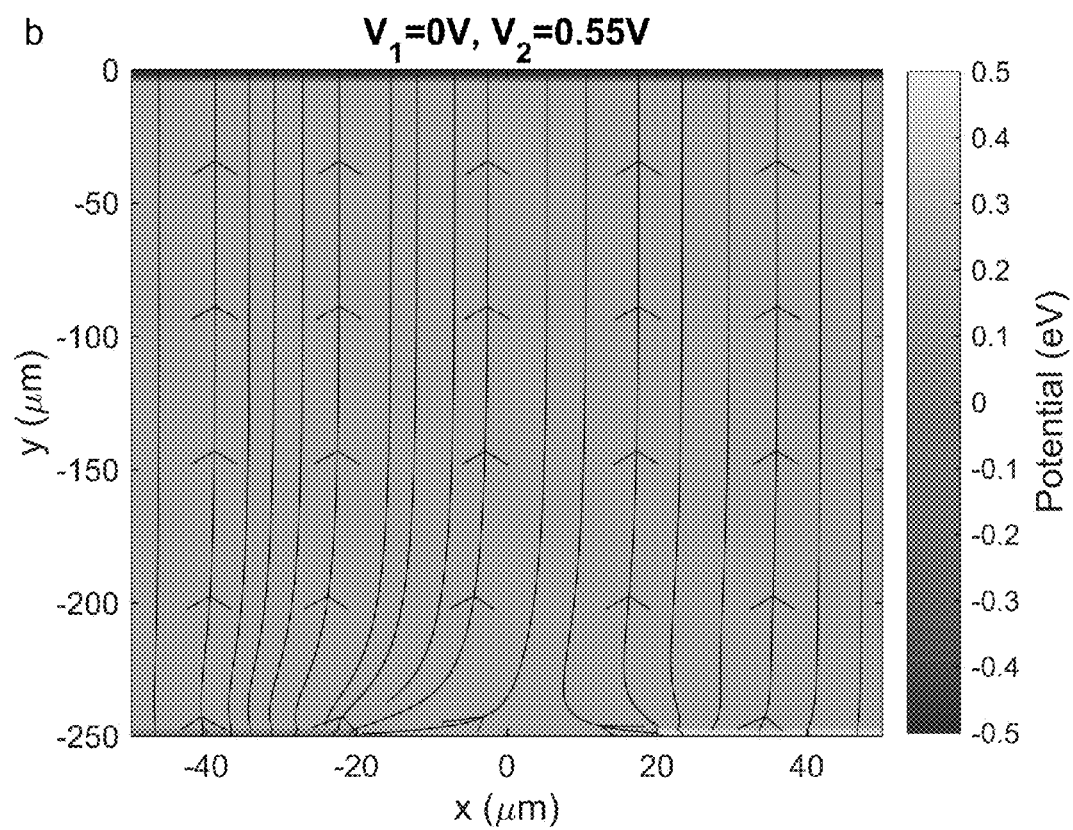
Figure 4C:
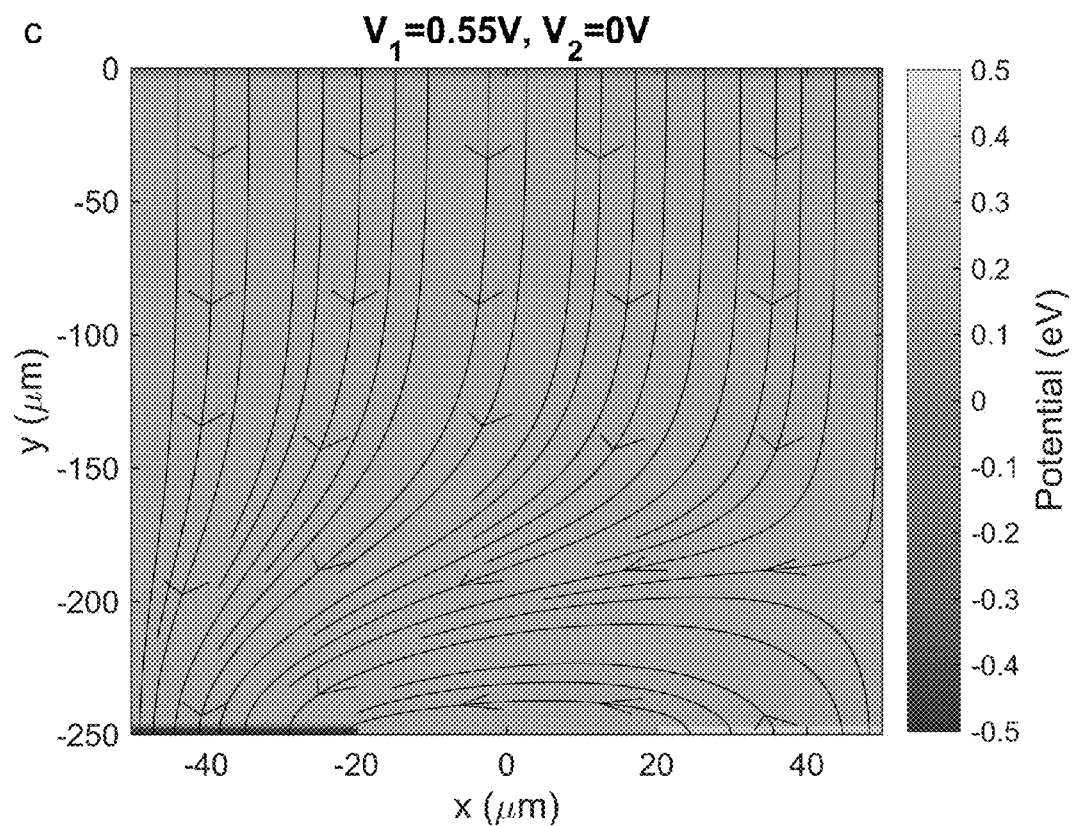

FIGS. 4A-4C show examples of streamlines of the current flow through the three terminal solar cell under 1 sun illumination through the top surface and different biases. FIG. 4A shows streamlines of the current flow through the three terminal solar cell when all contacts are short circuited. FIG. 4B shows streamlines of the current flow through the three terminal solar cell when the back $p^+$ contact is at $V_2=0.55V$ and the top contact is at $V_1=0$. FIG. 4C shows streamlines of the current flow through the three terminal solar cell when the top contact is at $V_1=0.55V$ and the back $p^+$ contact is at $V_2=0$. The shading shows the potential distribution within the cell.

The cell was illuminated through the top contact surface with a standard solar spectrum AM 1.5 G where only wavelengths that are not absorbed in the $TiO_2$ photo-catalyst are considered. When all contacts are short circuited (FIG. 4A), current from the common $n^+$ contact is split between the two other contacts. More current is driven through the top contact because most of the minority charge carriers are generated next to it. When the back $p^+$ contact is at $V_2=0.55V$ (FIG. 4B), which is slightly above its open circuit voltage, current from both back contacts flows towards the top contact. Finally, when the top contact is at $V_1=0.55V$ (FIG. 4C), current is injected from this contact into the cell and the sum of the top contact and the common contact currents is extracted through the back $p^+$ contact.

Figure 4D:
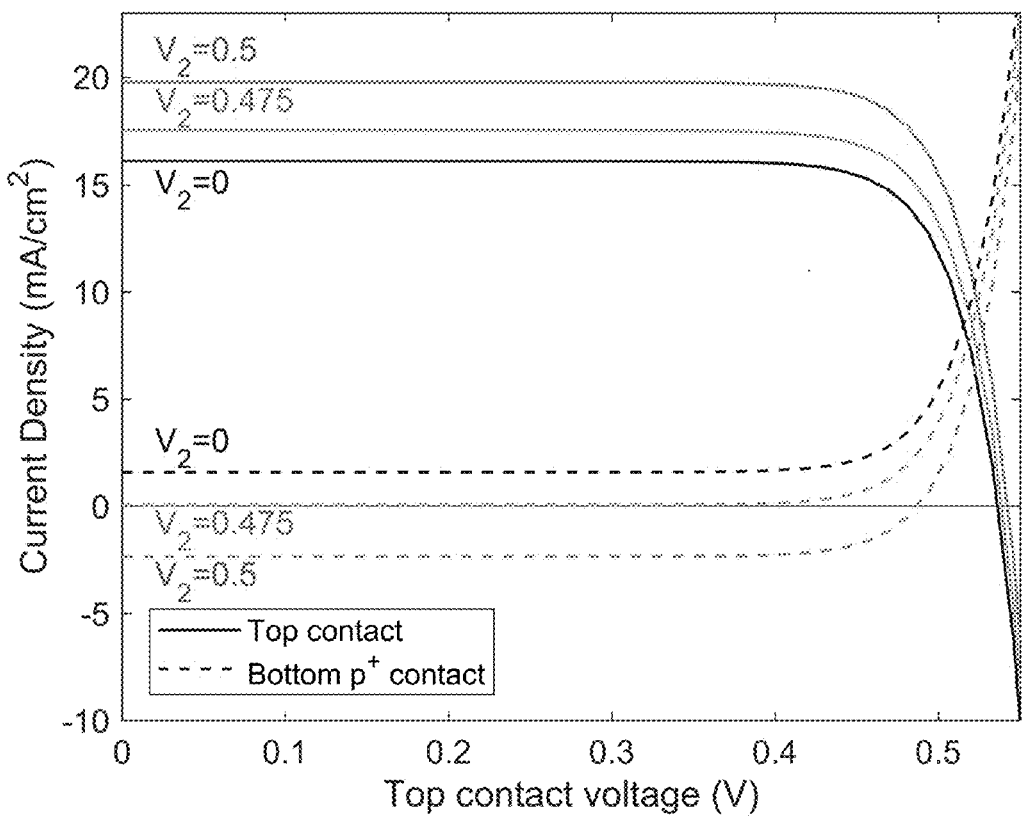
FIG. 4D shows an example of the top and back $p^+$ contact currents as a function of the top contact voltage and several back $p^+$ contact voltages.

FIG. 4D shows an example of the top and back $p^+$ contact currents as a function of the top contact voltage and several back $p^+$ contact voltages. Positive currents indicate that power is passed from the cell to the external circuit and negative currents indicate that power is passed from the external circuit into the cell. When $V_2=0$ and the top contact voltage, $V_1$, is low, most of the current is extracted through the top contact. However, with increasing $V_1$, less current can pass through and as a result the current through the bottom contact increases. When $V_1$ passes the contact's open circuit voltage, the current through to top contact changes sign; i.e., the contact is injecting current into the device towards the bottom $p^+$ contact. In a similar manner, with increasing $V_2$, less current is extracted through the bottom $p^+$ contact and the current top contact current increases. Once again, for high enough $V_2$, current is injected through the back $p^+$ contact into the device further increasing the current through the top contact. Hence, the current through both top and bottom $p^+$ contact depends on both $V_1$ and $V_2$.

Figure 5:
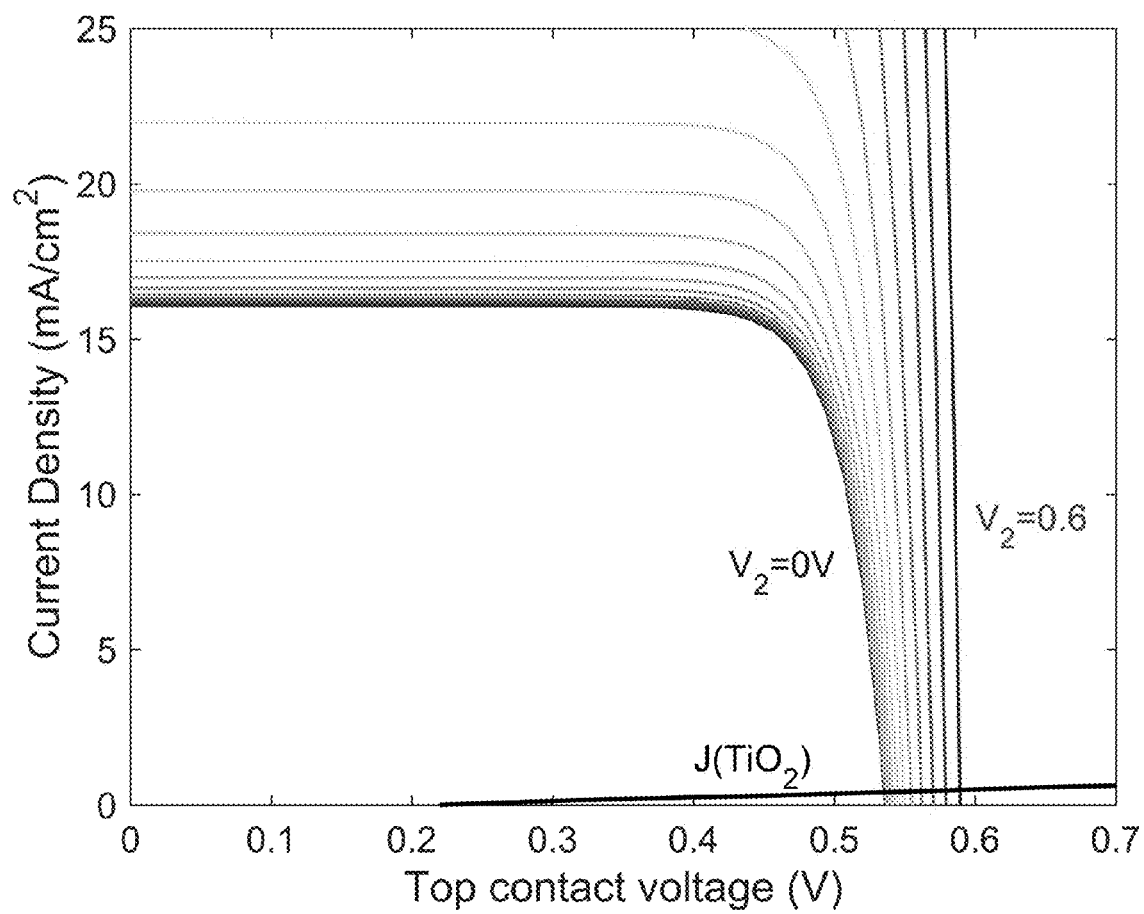
FIG. 5 shows an example of the top contact current for several values of $V_2$.

As described above, the top contact is coupled in series to a photo-catalyst and its current density is determined by the chemical reaction. FIG. 5 shows an example of the top contact current voltage curves for several values of $V_2$. Also shown is an electrochemical load curve of a $TiO_2$ photocatalyst splitting water and generating hydrogen. Since the operating point of the electrochemical route is the intersection of each current voltage curve with the electrochemical load, both the chemical and electrical output can be controlled by $V_2$, the electrical route voltage.

Figure 6:
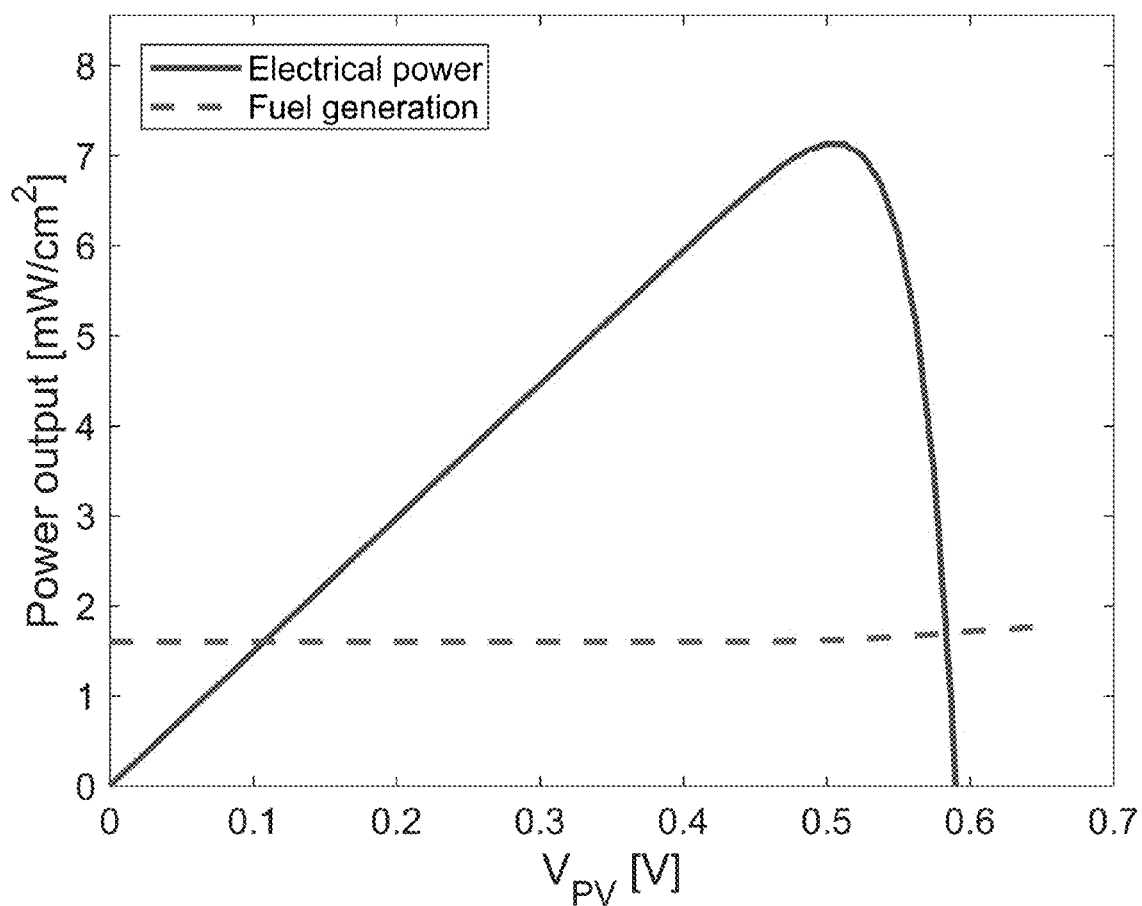
FIG. 6 shows and example of the electrical and chemical power output as a function of the electrical route voltage.

FIG. 6 shows an example of the electrical and chemical power output as a function of the electrical route voltage. Because the current consumed by the chemical reaction is much lower than the total number of photogenerated electrons, significant power is produced by the electrical route without impeding the fuels generation. At its maximum power point, the electrical route produces more than 7 mW/cm$^2$, an absolute 7% solar conversion efficiency. It should be noted that the electric route current is mostly limited by the bulk thickness (about 250 microns) which was chosen to match fabrication capabilities, but is very far from the optimal thickness. Further optimization of the device geometry can increase the device performance significantly.

Example—Conceptual Calculations

The potential contribution of the HPEV technology to the total energy produced by a solar fuels plant can be estimated through equivalent circuit modeling. Following the simulation results presented above, it was assumed that the PEC current is independent of the PV route electrical operating point. Hence, the maximum current available for extraction, $J_{SG}$, follows:

$$J_{sc} = q \int_0^{E_{g,PEC}} \Phi(E) \cdot EQE(E) dE - J_{PEC} \qquad (1)$$

where $\Phi(E)$ is the solar spectrum EQE(E) is the cell external quantum efficiency, q is the elementary charge, $E_{g,PEC}$ is the bandgap of the photo-catalyst layer, and $J_{PEC}$ is the current extracted by the photoelectrochemical route. The current density that can be collected at a given operating point follows the standard single diode equivalent circuit equation:

$$J_{PV} = J_{sc} J_0 \left( \exp\left( \frac{q(V + J_{PV} \cdot R_s)}{nKT} \right) 1 \right) \qquad (2)$$

where $J_0$ is the diode saturation current, $J_{PV}$ and V are the PV route current density and voltage, respectively, $R_s$ is the series resistance, n is the diode ideality factor, K is Boltzmann's constant, and T is the operating temperature. Hence, for a given photo-catalyst layer band gap and current density and a known set of solar cells parameters, the current voltage characteristics of the PV route can be calculated from which the maximum power point is extracted.

Figure 7:
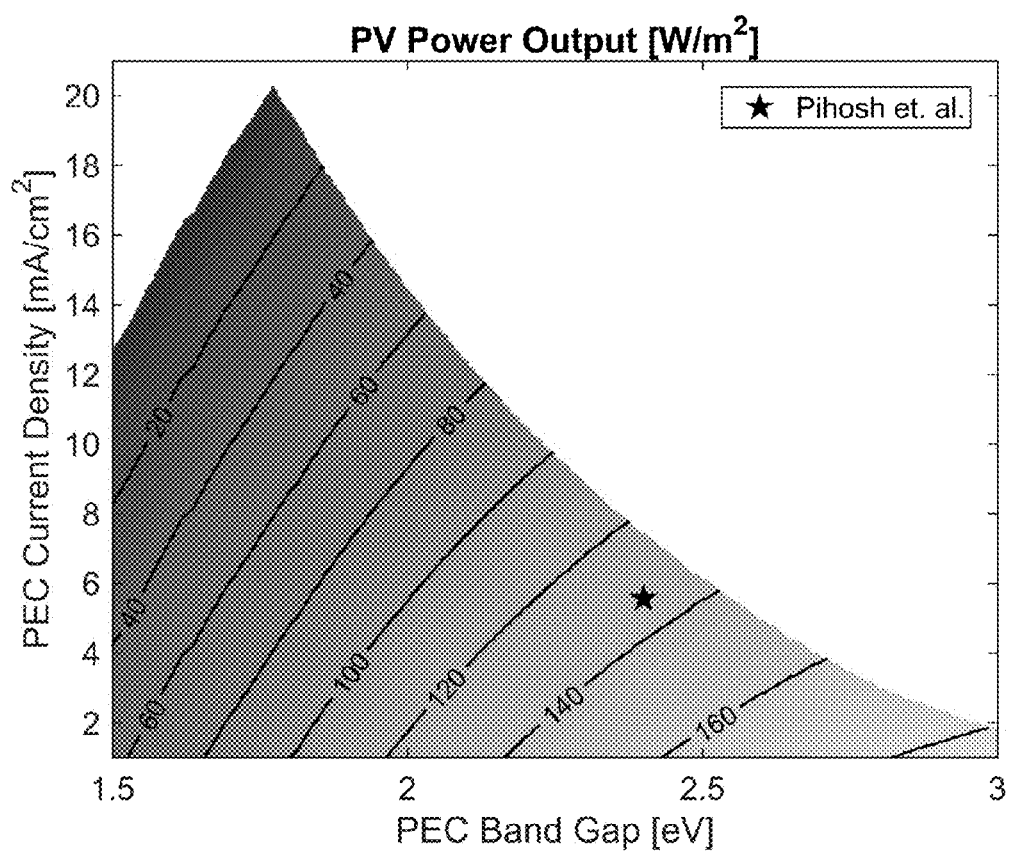
FIG. 7 shows an example of the PV route output power as a function of the PEC route current and photo-catalyst layer band gap.

FIG. 7 shows an example of the calculated PV route power output as a function of the photo-catalyst current density and band gap. The star marks the BVO layer reported in Y. Pihosh et al., "Photocatalytic generation of hydrogen by core-shell $WO_3/BiVO_4$ nanorods with ultimate water splitting efficiency," *Sci. Rep.*, vol. 5, p. 11141, June 2015, with a band gap of 2.4 eV and a current density of 5.57 mA at the intersection between the PEC and solar cell current voltage curves. The PV cell parameters were extracted out of the current voltage curve and EQE data reported in W. W. P. Mulligan et al, "Manufacture of solar cells with 21% efficiency," Proc. 19th EPVSEC, no. 408, pp. 3-6, 2004, which represents a state of the art back contact solar cell. As was expected, the PV route power output is reduced as the PEC current increases and the PEC band gap reduced. However, it should be noted that even for ideal photo-catalysts, the PV route produces significant amount of electrical power. For example, an ideal PEC with a band gap of 2.35 eV generates a current density of 8.13 mA/cm² (10% solar to hydrogen efficiency). In this case the PV route power output is 117 W/m². Considering 97% efficient DC-AC conversion, down time of 10%, 10% dust, and an annual average insolation of 276 W/m², the power output is reduced to 25.3 W/m². Assuming a hydrogen plant with a power draw of 2.8 W/m², the electrical power available to the grid becomes 22.5 W/m². Under the same set of assumptions, a 10% efficient water splitting plant produces 24.3 W/m², the HPEV technology nearly doubles the overall plant power output.

Example—HPEV Cell Fabrication

Demonstration HPEV cells were fabricated by depositing a $TiO_2$ water splitting layer on a three terminal silicon solar cell. The front and back surface p⁺ regions were fabricated by ion implantations of boron ions at a dosage of (1) $3 \times 10^{14}$ atoms/cm³ and an energy of 32 KeV and (2) $5 \times 10^{14}$ and an energy of 50 KeV. The back surface n⁺ regions where formed by phosphorous ion implantations at a dosage of (1) $2 \times 10^{14}$ and an energy of 33 KeV and (2) $5 \times 10^{14}$ an energy of 75 KeV. The front surface p⁺ region covered the entire surface. The dopant concentration profiles corresponding to these dosages and energies can estimated through modeling software. The p⁺ and n⁺ regions were masked to form interlaced finger structures where each finger was 60 microns wide with a 100 micron spacing between fingers. The ion implantation processes were followed by rapid thermal annealing at 900° C. for 10 seconds. The substrate was 250 micron thick Czochralski grown 5-10Ω n-type silicon. Once all doping profiles were formed and activated, the layer of fluorinated tin oxide (FTO) contact was deposited by ultrasonic spray pyrolysis. The $TiO_2$ layer was deposited by electron beam evaporation at 350° C. followed by 2 hours of air annealing at 500° C. Finally, back contacts were fabricated by electron beam evaporation of gold fingers on to the back surface.

Example—HPEV Cell Characterization

The photoelectrochemical performance of a HPEV cell was tested in a three electrode arrangement where the counter electrode, an Ag/AgCl reference electrode, and the common contact were connected to a potentiostat. The electrical performance of the HPEV cell was tested by connecting the common contact and the back p⁺ contact to a second potentiostat in a two electrode configuration. The photoelectrochemical performance of the HPEV cell was tested in a 1M NaOH electrolyte. In order to better understand the performance of three terminal silicon solar cell, measurements were conducted with a Class AAA solar simulator and a UV LED. The output of the LED was tuned in order to control the intensity of the light absorbed in the $TiO_2$ layer and with it the amount of current extracted by it. At a first stage, each component was tested separately such that the counter electrode was disconnected when the electrical route was tested and the back p⁺ contact was disconnected while the photoelectrochemical performance was tested.

Figure 8A:
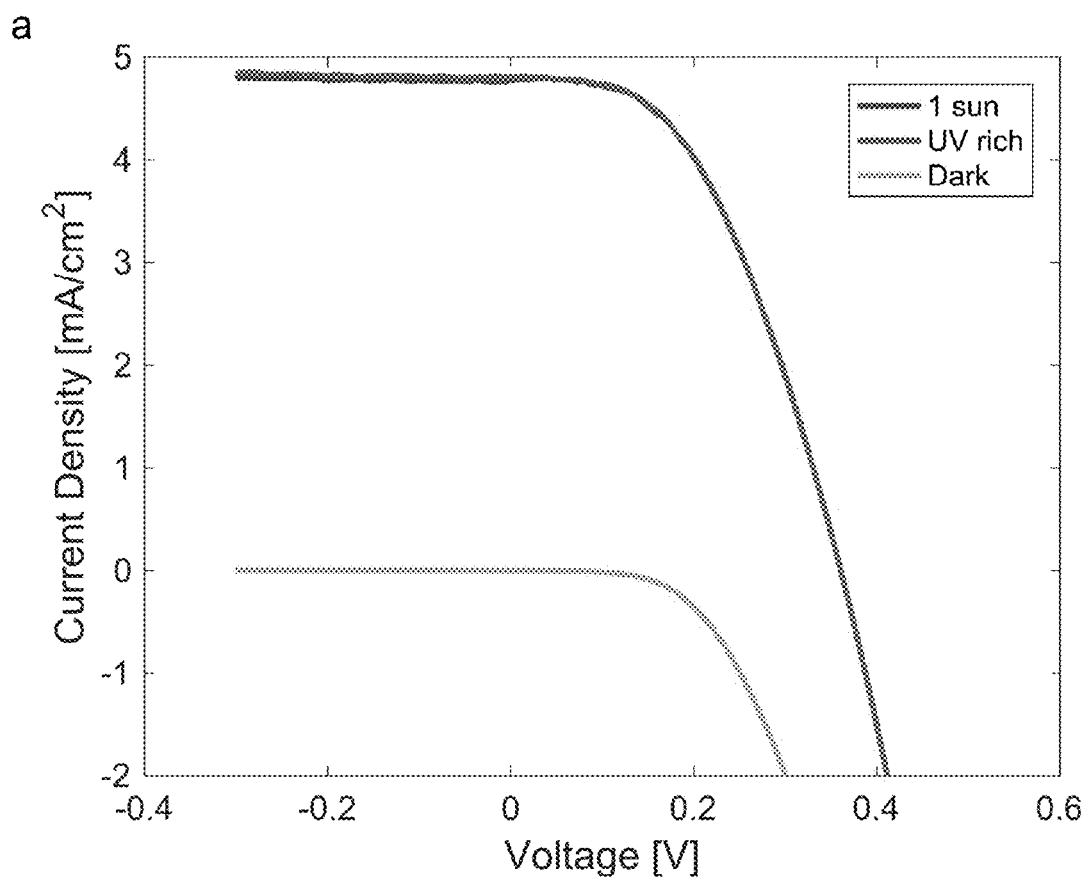
FIG. 8A shows an example of the electrical current voltage curves under dark, 1 sun solar simulator illumination and under solar simulator and UV LED illumination for a demonstration HPEV cell.
Figure 8B:
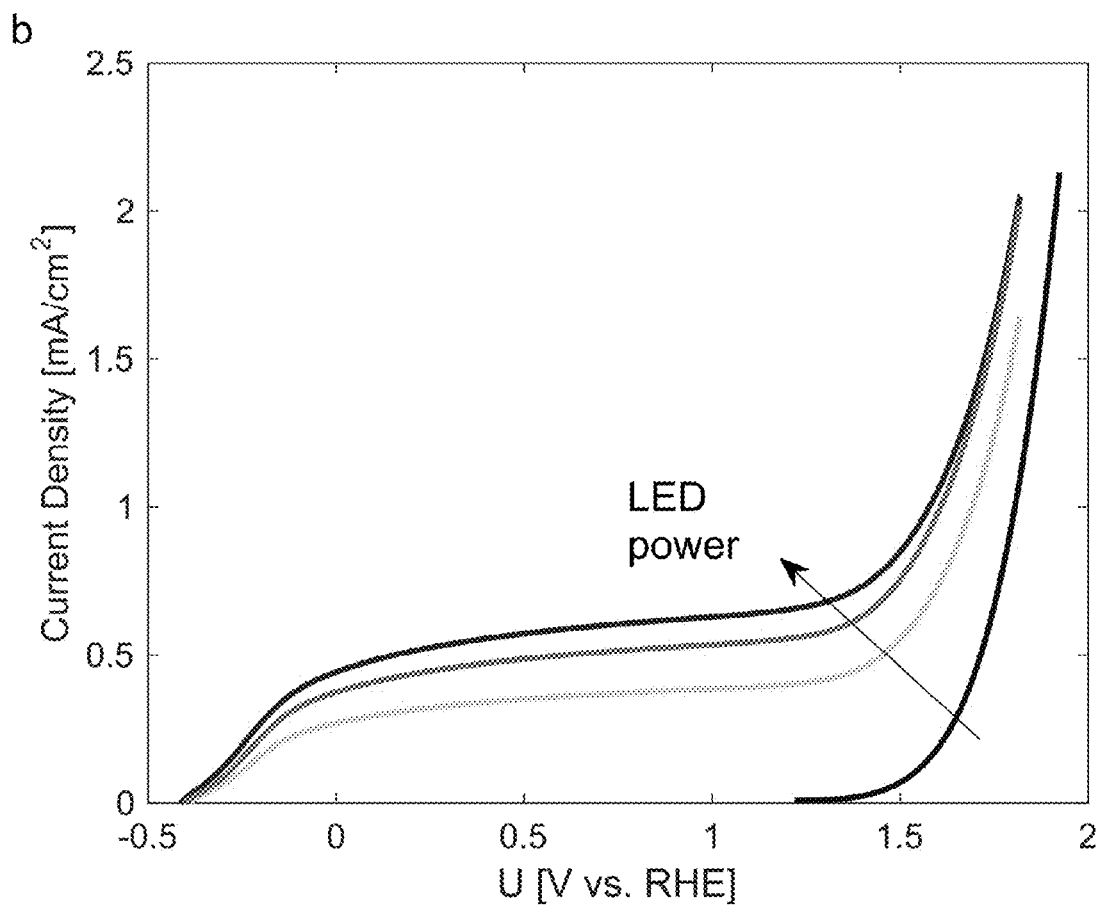
FIG. 8B shows an example of the photoelectrochemical current voltage curves under dark, 1 sun solar simulator illumination and under solar simulator and UV LED illumination for a demonstration HPEV cell. In the demonstration HPEV cell, the counter electrode was disconnected when measuring the electrical performance and the back $p^+$ contact was disconnected when measuring the photoelectrochemical performance.

FIGS. 8A and 8B show the electrical and photoelectrochemical output, respectively, of each part of the HPEV cell in the dark, under the solar simulator illumination, and with the solar simulator and LED. As shown in FIG. 8A, the back contacts show solar cell behavior with a short circuit current density of about 4.8 mA/cm² and an open circuit voltage of 0.36V. Since the UV light is absorbed entirely in the $TiO_2$, and the counter electrode is disconnected, increasing the UV content with the LED has no effect on the electrical performance of the HPEV cell. The low short circuit current and open circuit voltage are due to the thickness of the wafer being much larger than the diffusion length of the minority carriers. The performance of the HPEV cells is heavily impeded if the wafer thickness is too large because in back contact solar cells, the minority carriers must diffuse all the way to the back contacts. Unlike the electrical performance, the photoelectrochemical current increases dramatically with the UV illumination. When illuminated with high energy photons, more charge carriers are photogenerated within the $TiO_2$, increasing the water splitting current.

The combined performance of the entire device was tested by measuring the electrical and photoelectrochemical performance simultaneously over time. In these measurements, the voltage between the two back contacts was controlled by one potentiostat and the common contact potential was set to 1.23V vs RHE, emulating a device with a perfect water splitting cathode. The currents through the back contacts and through the counter electrode were measured simultaneously while the voltage between the two back contacts was ramped to produce a full current voltage curve.

Figure 9:
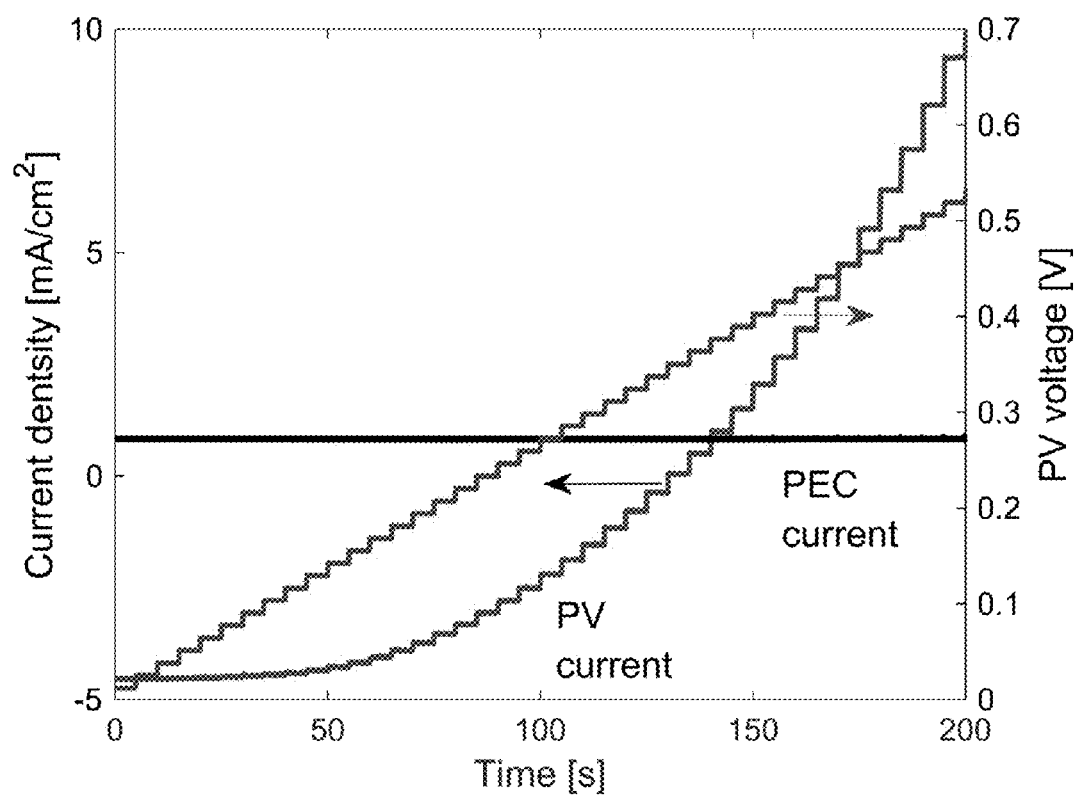
FIG. 9 shows an example of a combined performance measurement of a demonstration HPEV cell. In the demonstration HPEV cell, the back contacts voltage was set by one potentiostat, the common contact potential was fixed at 1.23V vs RHE, and both electrical and photoelectrochemical currents were measured simultaneously.

FIG. 9 shows the raw output of such a measurement. The right vertical axis marks the voltage between the two back contacts, which defines the operating voltage of the photovoltaic cell. At every operating voltage two currents are measured, and the curves in FIG. 9 can be translated to two current voltage curves describing the PEC and PV currents as a function of the PV voltage.

Figure 10:
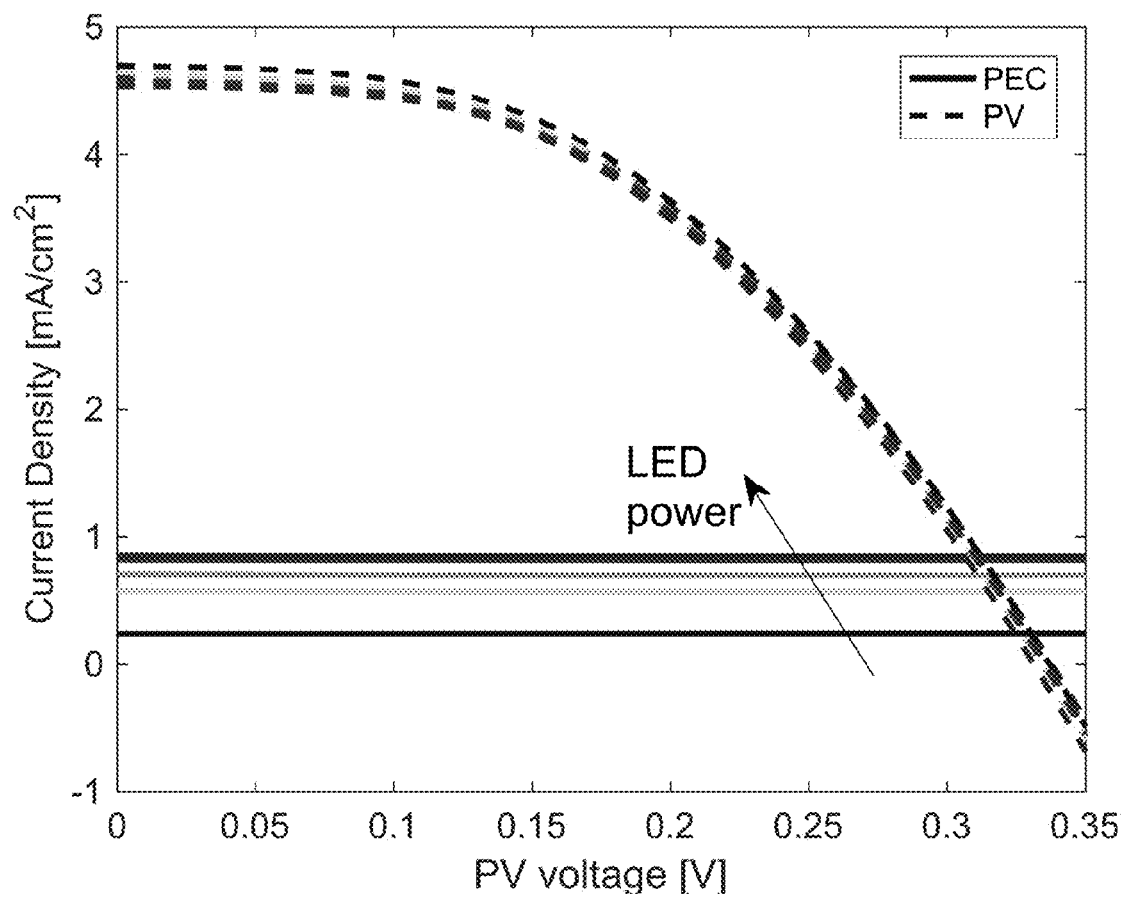
FIG. 10 shows an example of the full device performance of a demonstration HPEV cell. PEC and PV currents as a function of the back contacts voltage are shown for several UV LED power outputs.

FIG. 10 shows the PEC and PV current densities extracted from measurements (e.g., as shown in FIG. 9) conducted under several UV LED intensities. As predicted by the simulations, the PEC current is nearly independent of the electrical operating point, allowing for the extraction of electrical power at the maximum power point without impeding the PEC output. As in the isolated measurements shown in FIG. 8B, the PEC current density increases with the LED power. However, when increasing the PEC current, fewer charge carriers are available for collection by the back contacts, leading to a reduction in the PV short circuit current. The reduction in the PV short circuit current is smaller than the increase in the PEC current because some of the carriers injected into the FTO and $TiO_2$ layers are photo generated near the front surface, which is at a fairly long distance from the back contact. Hence, if these carriers would have not been injected to the FTO and $TiO_2$ layers, they would have recombined instead of reaching the back contacts.

Three Terminal, Triple Junction Solar Cell

In standard multi-junction solar cells, all sub-cells are connected in series and are sharing the same current. However, since the band gap of the bottom sub-cell is significantly smaller than the other layers, it suffers from severe mismatch losses. Hence, the same concepts described above for extraction of surplus currents can be also utilized in multi-junction solar cells.

Figure 11:
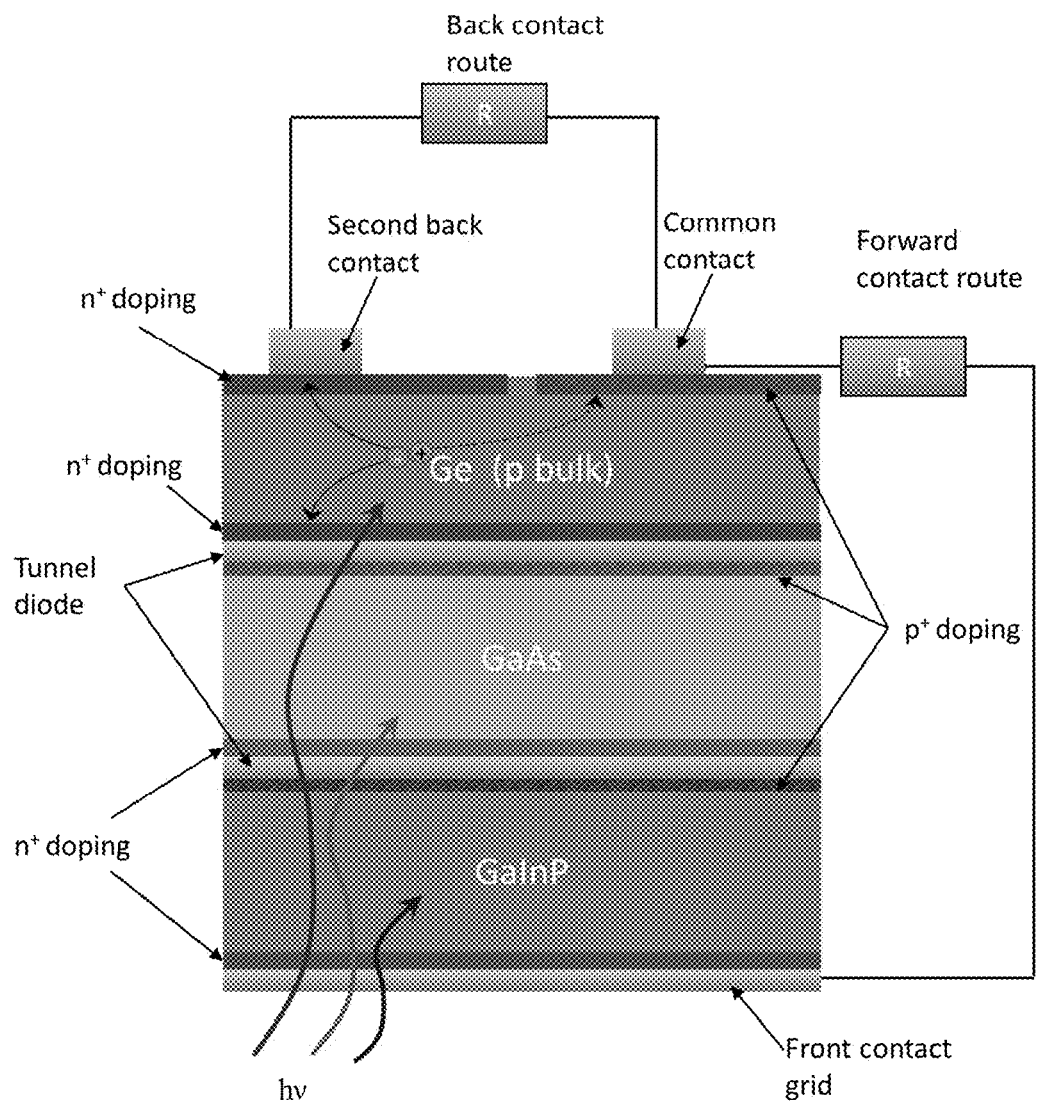
FIG. 11 shows an example of a schematic illustration of a three terminal, triple junction solar cell

FIG. 11 shows an example of a schematic illustration of a three terminal, triple junction solar cell. In this example, the second back contact is added to the Ge substrate with an opposite polarity allowing the two electrical routs to operate nearly independently. In this example the Ge substrate is p-type however, the same concepts can be utilized with n-type substrates simple by using opposite polarities, or with other multi-junction cell materials.

The possibility to extract the germanium surplus current was suggested by T. Nagashima et al., "Three-terminal tandem solar cells with a back-contact type bottom cell," Conf. Rec. IEEE Photovolt. Spec. Conf., vol. 2000-January, pp. 1193-1196, 2000. However, in Nagashima, the two electrical routes form a $p^+pp^+$ junction. As a result, they are effectively connected in parallel preventing the back contact route from operating at its maximum power point. The performance of a three terminal triple junction cell was estimated using the equivalent circuit model presented in Walczak, K. A., Segev, G., Larson, D. M., Beeman, J. W., Houle, F. A., and Sharp, I. D. (2017). "Hybrid Composite Coatings for Durable and Efficient Solar Hydrogen Generation under Diverse Operating Conditions." Adv. Energy Mater. 7, 1602791, where the current through the germanium back contacts was calculated according to equations (1) and (2). The series resistance was taken to be 0.050 representing the series resistance of multi-junction cells designed to operate under high solar flux concentration.

Figure 12:
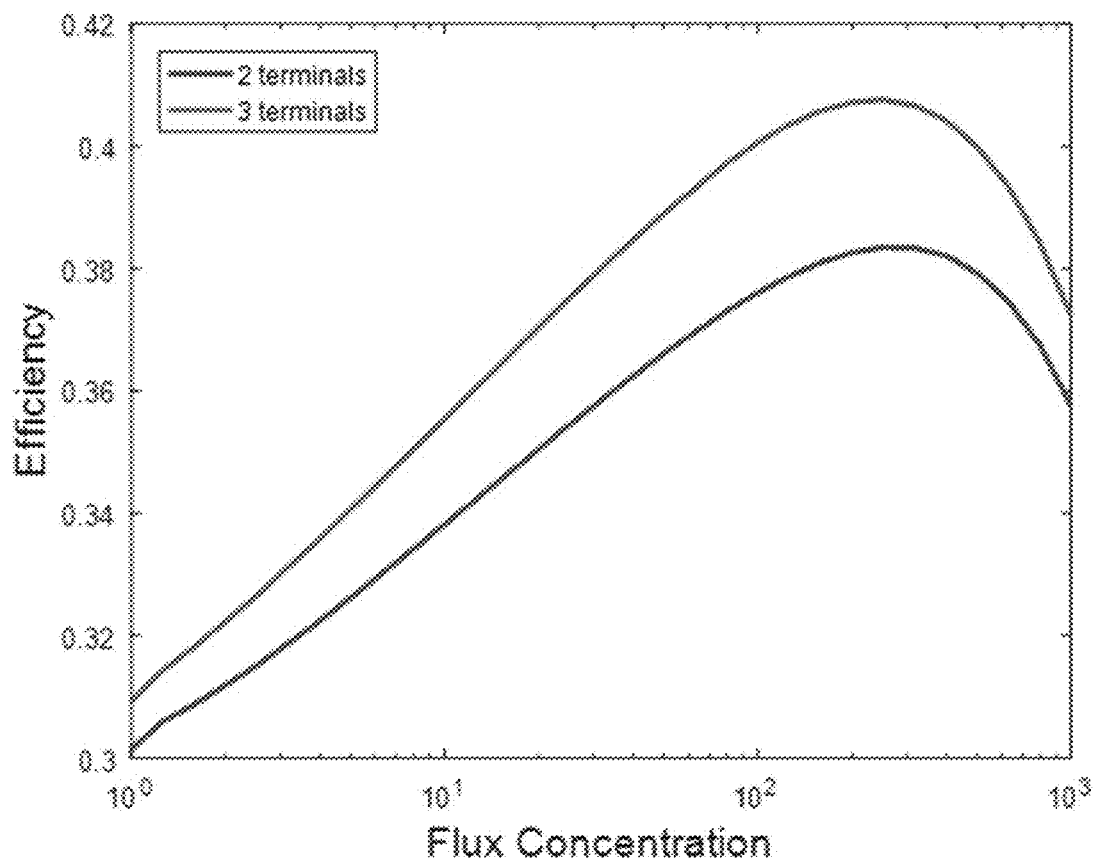
FIG. 12 shows an example of the calculated efficiencies for two and three terminal, multi-junction solar cells as a function of the flux concentration.

FIG. 12 shows an example of the calculated efficiencies for two and three terminal, multi-junction solar cells as a function of the flux concentration. The incorporation of the second back contact results in an increase of nearly 2% in the solar conversion efficiency.

CONCLUSION

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
a substrate comprising a semiconductor, the substrate being doped with a first n-type dopant, a first area of a first surface of the substrate being heavily doped with a first p-type dopant, a second area of the first surface of the substrate being heavily doped with a second n-type dopant, a third area of the substrate being between the first area and the second area, a second surface of the substrate being heavily doped with a second p-type dopant;
a transparent conductor disposed on the second surface of the substrate;
a photoanode disposed on the transparent conductor;
an electrolyte in electrical communication with the photoanode; and
an electrode in contact with the electrolyte, the electrode being in electrical contact with the second area, the first area being in electrical contact with the second area through an electrical load.

2. The device of claim 1, wherein the semiconductor is selected from a group consisting of silicon, germanium, gallium arsenide, cadmium telluride, and gallium indium phosphide.

3. The device of claim 1, wherein the substrate is about 100 microns to 300 microns thick.

4. The device of claim 1, wherein the first n-type dopant and the second n-type dopant are selected from a group consisting of phosphorus, arsenic, and antimony.

5. The device of claim 1, wherein the first p-type dopant and the second p-type dopant are selected from a group consisting of aluminum and boron.

6. The device of claim 1, wherein the semiconductor is doped to a level of about $10^{14}$ atoms/cm$^3$ to $10^{16}$ atoms/cm$^3$.

7. The device of claim 1, wherein the first area, the second area, and the second surface are doped to a level of about $10^{18}$ atoms/cm$^3$ to $10^{20}$ atoms/cm$^3$.

8. The device of claim 1, wherein the electrolyte comprises sodium hydroxide, potassium hydroxide, or sulfonic acid.

9. The device of claim 1, wherein the photoanode is selected from a group consisting of gallium indium phosphide, iron oxide, and bismuth vanadate.

10. The device of claim 1, wherein the electrode comprises a photocathode, and wherein the photocathode comprises gallium phosphide.

11. A device comprising:
a substrate comprising a semiconductor, the substrate being doped with a first p-type dopant, a first area of a first surface of the substrate being heavily doped with a first n-type dopant, a second area of the first surface of the substrate being heavily doped with a second p-type dopant, a third area of the substrate being between the first area and the second area, a second surface of the substrate being heavily doped with a second n-type dopant;

a transparent conductor disposed on the second surface of the substrate;

a photocathode disposed on the transparent conductor;

an electrolyte in electrical communication with the photocathode; and an electrode in contact with the electrolyte, the electrode being in electrical contact with the second area, the first area being in electrical contact with the second area through an electrical load.

12. The device of claim 11, wherein the semiconductor is selected from a group consisting of silicon, germanium, gallium arsenide, cadmium telluride, and gallium indium phosphide.

13. The device of claim 11, wherein the substrate is about 100 microns to 300 microns thick.

14. The device of claim 11, wherein the first n-type dopant and the second n-type dopant are selected from a group consisting of phosphorus, arsenic, and antimony.

15. The device of claim 11, wherein the first p-type dopant and the second p-type dopant are selected from a group consisting of aluminum and boron.

16. The device of claim 11, wherein the semiconductor is doped to a level of about $10^{14}$ atoms/cm$^3$ to $10^{16}$ atoms/cm$^3$.

17. The device of claim 11, wherein the first area, the second area, and the second surface are doped to a level of about $10^{18}$ atoms/cm$^3$ to $10^{20}$ atoms/cm$^3$.

18. The device of claim 11, wherein the electrolyte comprises sodium sulfate, sodium borate, or sulfonic acid.

19. The device of claim 11, wherein the photocathode is selected from a group consisting of gallium phosphide, gallium indium phosphide, and cuprous oxide.

20. The device of claim 11, wherein the electrode comprises a photoanode, and wherein the photoanode is selected from a group consisting of gallium indium phosphide, iron oxide, and bismuth vanadate.

* * * * *